(12) United States Patent
Kuwaharada et al.

(10) Patent No.: US 8,508,689 B2
(45) Date of Patent: Aug. 13, 2013

(54) LIGHT-EMITTING DEVICE, SURFACE LIGHT-EMITTING APPARATUS, DISPLAY SYSTEM

(75) Inventors: Takashi Kuwaharada, Kagoshima (JP); Tooru Aoyagi, Kagoshima (JP); Hiroshi Yamaguchi, Osaka (JP); Seiji Hamada, Osaka (JP); Motonobu Yoshikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 352 days.

(21) Appl. No.: 12/808,280

(22) PCT Filed: Jun. 22, 2009

(86) PCT No.: PCT/JP2009/002821
§ 371 (c)(1),
(2), (4) Date: Jun. 15, 2010

(87) PCT Pub. No.: WO2009/157166
PCT Pub. Date: Dec. 30, 2009

(65) Prior Publication Data
US 2010/0259706 A1    Oct. 14, 2010

(30) Foreign Application Priority Data
Jun. 23, 2008 (JP) .................................. 2008-162927

(51) Int. Cl.
*G02F 1/1335* (2006.01)
(52) U.S. Cl.
USPC .............................................. 349/62; 349/61

(58) Field of Classification Search
USPC ...................................................... 349/61–69
See application file for complete search history.

(56) References Cited

U.S. PATENT DOCUMENTS

| 6,607,286 | B2 * | 8/2003 | West et al. ..................... 362/255 |
| 7,339,200 | B2 | 3/2008 | Amano et al. |
| 7,344,902 | B2 | 3/2008 | Basin et al. |
| 7,348,723 | B2 | 3/2008 | Yamaguchi et al. |
| 7,352,011 | B2 | 4/2008 | Smits et al. |
| 7,414,270 | B2 | 8/2008 | Kim et al. |
| 7,452,737 | B2 | 11/2008 | Basin et al. |
| 7,621,657 | B2 | 11/2009 | Ohkawa |

(Continued)

FOREIGN PATENT DOCUMENTS

| JP | 2002-344027 | 11/2002 |
| JP | 2004-281606 | 10/2004 |

(Continued)

*Primary Examiner* — Dung Nguyen
(74) *Attorney, Agent, or Firm* — McDermott Will & Emery LLP

(57) ABSTRACT

A light-emitting device includes a light-emitting element 110; and a lens section 132 covering over the light-emitting element 110. The lens section 132 includes an entrance surface S1 on which light from the light-emitting element 110 is incident; an exit surface S2 from which the light incident on the entrance surface S1 is emitted; and an optical axis L extending so as to penetrate the entrance surface S1 and the exit surface S2. A concave section 132a is formed in an area of the exit surface S2, which contains the optical axis L, and two flat sections 132b are formed so as to face each other across the optical axis L. The exit surface S2 defines an upwardly-protruding curved surface formed between the two flat sections 132b, and the optical axis L is coincidence with a reference optical axis of the light-emitting element 110.

10 Claims, 8 Drawing Sheets

(56) References Cited

U.S. PATENT DOCUMENTS

| | | |
|---|---|---|
| 7,625,102 B2 | 12/2009 | Koike et al. |
| 8,109,658 B2 * | 2/2012 | Matsuki et al. .......... 362/311.02 |
| 2004/0223315 A1 | 11/2004 | Suehiro et al. |
| 2005/0243577 A1 | 11/2005 | Moon |
| 2006/0034097 A1 | 2/2006 | Hahm et al. |
| 2006/0066218 A1 | 3/2006 | Yamaguchi et al. |
| 2006/0083002 A1 | 4/2006 | Koike et al. |
| 2006/0208269 A1 | 9/2006 | Kim et al. |
| 2007/0029563 A1 | 2/2007 | Amano et al. |
| 2008/0002412 A1 * | 1/2008 | Tanaka et al. ................. 362/307 |
| 2008/0007966 A1 | 1/2008 | Ohkawa |
| 2008/0013322 A1 | 1/2008 | Ohkawa |
| 2008/0048200 A1 | 2/2008 | Mueller et al. |
| 2008/0157114 A1 | 7/2008 | Basin et al. |
| 2008/0192479 A1 | 8/2008 | Wanninger |
| 2008/0210962 A1 | 9/2008 | Blumel et al. |
| 2008/0297020 A1 | 12/2008 | Wanninger et al. |
| 2009/0213469 A1 | 8/2009 | Braune et al. |
| 2010/0073907 A1 | 3/2010 | Wanninger et al. |
| 2010/0277672 A1 * | 11/2010 | Matsuki et al. ................. 349/64 |

FOREIGN PATENT DOCUMENTS

| | | |
|---|---|---|
| JP | 2005-317977 | 11/2005 |
| JP | 2006-054407 | 2/2006 |
| JP | 2006-114347 | 4/2006 |
| JP | 3875247 | 11/2006 |
| JP | 2007-048775 | 2/2007 |
| JP | 2007-227410 | 9/2007 |
| JP | 2007-294187 | 11/2007 |
| JP | 2008-010693 | 1/2008 |
| JP | 4182784 | 9/2008 |
| JP | 4418799 | 12/2009 |

* cited by examiner (a)

(b)

(a)

(b)

(c)

(a)

(b)

LIGHT-EMITTING DEVICE, SURFACE LIGHT-EMITTING APPARATUS, DISPLAY SYSTEM

RELATED APPLICATIONS

This application is the U.S. National Phase under 35 U.S.C. §371 of International Application No. PCT/JP2009/002821, filed on Jun. 22, 2009, which in turn claims the benefit of Japanese Application No. 2008-162927, filed on Jun. 23, 2008, the disclosures of which Applications are incorporated by reference herein.

TECHNICAL FIELD

The present invention relates to a light-emitting device including a light guiding section for guiding light from an entrance surface to an exit surface; a surface light-emitting apparatus; and a display system.

BACKGROUND ART

In order to illuminate a liquid crystal display panel etc., a back light has been used, in which light-emitting devices are arranged in lines along side surfaces of a light guiding plate. In addition, when irradiating a large-size display section of, e.g., a liquid crystal television with light from a back side, a back light has been known, in which a plurality of light-emitting devices are arranged in matrix on a large-size wiring substrate.

As light-emitting devices used for a large-size back light, a light-emitting device provided by combining a light-emitting element which is a point light source with a luminous flux control member (light guiding member) has been known (see, e.g., Patent Document 1). The light guiding member has, e.g., an approximately rounded quadrangular planar shape, and a hemispherical hollow is formed around a light emission center of the light-emitting element. A first light exit surface portion defining a smoothly-curved surface which downwardly protrudes at the center of a light exit surface, and a second light exit surface portion continuously formed so as to surround the first light exit surface portion, and defining a smoothly-curved surface which upwardly protrudes are formed on an outer surface side as an emission control surface.

In a surface light-emitting apparatus in which such light-emitting devices are arranged in matrix, each of the light-emitting devices can continuously diffuse light from the light-emitting element within a desired area to be irradiated, thereby obtaining illumination light with uniform luminance.

CITATION LIST

Patent Document

PATENT DOCUMENT 1: Japanese Patent Publication No. 2007-227410

SUMMARY OF THE INVENTION

Technical Problem

However, the conventional light-emitting device has the following problems. Since the conventional light-emitting device has the luminous flux control member having the approximately rounded quadrangular shape, and including the hemispherical hollow at the center, light is uniformly diffused in all directions. Thus, if the light-emitting devices are arranged in a square-grid pattern at equal intervals, illumination light with uniform luminance can be obtained. For a landscape-oriented display section, if the horizontal to vertical ratio is 16:9 in, e.g., a liquid crystal television with a panoramic screen, the ratio of the number of light-emitting devices in the horizontal direction to the number of light-emitting devices in the vertical direction is 16:9, thereby arranging the light-emitting devices in the square-grid pattern. However, the number of light-emitting devices is determined depending on luminosity and cost of the light-emitting device, and therefore it may be difficult to control the ratio of the number in the horizontal direction to the number in the vertical direction to 16:9. In such a case, the light-emitting devices are arranged in a rectangular-grid pattern in which intervals in the horizontal direction is different from intervals in the vertical direction. If the conventional light-emitting devices are arranged in the rectangular-grid pattern, illumination light from a light-emitting device is overlapped with illumination light from adjacent light-emitting device in the short axial direction, resulting in an excessive increase in luminance. In addition, illumination light from the light-emitting devices is insufficient in the long axial direction, resulting in a decrease in luminance. Consequently, there is a possibility that a display section cannot obtain uniform luminance.

It is an object of the present invention to provide a light-emitting device which can evenly illuminate a desired area even if the light-emitting devices are arranged in not only a square-grid pattern but also a rectangular-grid pattern; a surface light-emitting apparatus; and a display system.

Solution to the Problem

In order to accomplish the above-described object, the present invention includes light-emitting devices, each of which has a concave section formed in an exit surface, and two flat sections facing each other.

Specifically, the light-emitting device of the example includes a light-emitting element; and a lens section covering over the light-emitting element. The lens section includes an entrance surface on which light from the light-emitting element is incident; the exit surface from which the light incident on the entrance surface is emitted; an optical axis extending so as to penetrate through the entrance and exit surfaces; the concave section formed in an area of the exit surface, which contains the optical axis; and the two flat sections formed so as to face each other across the optical axis. The exit surface defines an upwardly-protruding curved surface formed between the two flat sections, and the optical axis is coincident with a reference optical axis of the light-emitting element.

Advantages of the Invention

According to the light-emitting device, the surface light-emitting apparatus, and the display system of the present invention, a light-emitting device which can evenly illuminate a desired area even if the light-emitting devices are arranged in not only a square-grid pattern but also a rectangular-grid pattern; a surface light-emitting apparatus; and a display system can be realized.

BRIEF DESCRIPTION OF THE DRAWINGS

FIG. 3(a) is a plan view. FIG. 3(b) is an cross-sectional view of FIG. 3(a). FIG. 3(c) is an IIIc-IIIc cross-sectional view of FIG. 3(a).

FIG. 5(a) illustrates the light distribution characteristics in a first virtual plane. FIG. 5(b) illustrates the light distribution characteristics in a second virtual plane.

DESCRIPTION OF EMBODIMENTS

Figure 1:
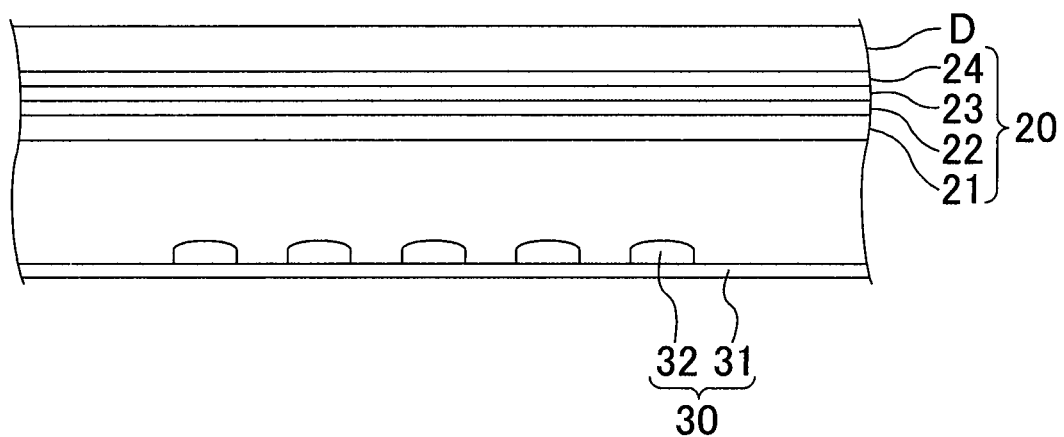
FIG. 1 is a cross-sectional view illustrating a display system of an embodiment.

An example of a light-emitting device includes a light-emitting element; and a lens section covering over the light-emitting element. The lens section includes an entrance surface on which light from the light-emitting element is incident; an exit surface from which the light incident on the entrance surface is emitted; an optical axis extending so as to penetrate through the entrance and exit surfaces; a concave section formed in an area of the exit surface, which contains the optical axis; and two flat sections formed so as to face each other across the optical axis. The exit surface defines an upwardly-protruding curved surface formed between the two flat sections, and the optical axis is coincident with a reference optical axis of the light-emitting element.

The example of the light-emitting device includes the concave section in the area of the exit surface, which contains the optical axis, of the lens section which is an approximately hemispherical lens, and the reference optical axis of the light-emitting element is coincidence with the optical axis of the lens section. Thus, light from the light-emitting element, which is incident on the light entrance surface, allows a section along the reference optical axis to be less brighter, thereby obtaining illumination light with uniform luminance. Portions of the exit surface, which face each other across the optical axis, are removed to form the flat sections. This allows light from the light-emitting element to the flat sections to be refracted toward the optical axis, and to be emitted together with light directly toward the exit surface. Thus, luminance on the sides where the flat sections are formed is increased, thereby obtaining a luminous intensity distribution in which light is widely diffused toward the sides where the flat sections are formed, with respect to the reference optical axis. Consequently, even when arranging the light-emitting devices in a rectangular-grid pattern, if the light-emitting devices are arranged so that the flat sections of the adjacent light-emitting devices face each other in the long axis direction, a desired area can be evenly illuminated.

In such a case, a light distribution curve in a first virtual plane containing the optical axis and connecting the two flat sections, and a light distribution curve in a second virtual plane perpendicular to the first virtual plane have the local maximum value in a particular angular direction. The local maximum value of the light distribution curve in the first virtual plane may be greater than the local maximum value of the light distribution curve in the second virtual plane.

In the example of the light-emitting device, the two flat sections may be parallel to each other, and may define surfaces parallel to the optical axis; and distances between each of the flat sections and the optical axis may be equal to each other. Alternatively, the flat sections may incline toward the optical axis to have angles between each of the flat sections and the optical axis, which are equal to each other.

In the example of the light-emitting device, the concave section may have a hemispherical shape; a conical shape; or a conical trapezoidal shape having an opening diameter larger than a bottom surface diameter.

In an example of a surface light-emitting apparatus, a plurality of light-emitting devices of the example are arranged in the grid pattern. The plurality of light-emitting devices are arranged so that the flat sections thereof face each other in a first direction; and, in a second direction perpendicular to the first direction, the light-emitting devices are arranged at intervals narrower than those in the first direction.

An example of a display system includes the surface light-emitting apparatus of the example; and an image display section using light from the surface light-emitting apparatus as a light source. The surface light-emitting apparatus of the example is used as the light source, thereby realizing an image display system in which non-uniform luminance is reduced. In such a case, the image display section may spatially modulate light from the surface light-emitting apparatus depending on image signals to display an image. The image display section receiving light from the surface light-emitting apparatus to partially change transmittance is provided, thereby adjusting brightness depending on an image, and reducing the non-uniform luminance. In addition, the image display section may be a transmissive liquid crystal panel. This allows an image without non-uniform luminance by uniform illumination from the surface light-emitting apparatus.

Embodiment

An embodiment will be described with reference to the drawings. FIG. 1 illustrates a cross-sectional structure of a surface light-emitting apparatus of the present embodiment. As illustrated in FIG. 1, a display system includes an image display section D; a light modulating member 20 arranged on a back side of the image display section D; and a surface light-emitting apparatus 30 arranged with a predetermined space from the light modulating member 20. The image display section D may be, e.g., a transmissive or semi-transmissive liquid crystal display panel.

In the display system of the present embodiment, the image display section D spatially modulates e.g., light from the surface light-emitting apparatus 30 depending on image signals to display an image. The semi-transmissive liquid crystal display panel etc. may be used for the image display section D, and light from the surface light-emitting apparatus 30 and outside light may be used depending on service spaces etc. The surface light-emitting apparatus 30 may be simply replaced with luminaries such as fluorescent lamps, or may be used as a back light. In such a case, the image display section D may be, e.g., a billboard made of material through which light is transmitted.

The light modulating member 20 includes a diffuser plate 21; a diffuser sheet 22; a first light modulating sheet 23; and a second light modulating sheet 24. The diffuser plate 21 is a frosted plate made of resin, which has rough surfaces in order to diffuse light from the surface light-emitting apparatus 30. The diffuser plate 21 may be made of, e.g., polycarbonate (PC), polyester (PS), and cyclic polyolefin (COP). The diffuser sheet 22 is a resin sheet provided in order to further diffuse the light diffused by the diffuser plate 21. The diffuser sheet 22 may be made of, e.g., polyester. The first light modulating sheet 23 has a prism surface made of polyester, on which triangular protrusions (linear triangular convex sections) made of acrylic are formed. The prism surface is formed so as to have a saw-like cross-sectional shape. The first light modulating sheet 23 collects the light diffused by the diffuser plate 21 and the diffuser sheet 22 so as to direct such light toward the image display section D. The second light modulating sheet 24 collects light which is not collected by the first light modulating sheet 23. In addition, in the second light modulating sheet 24, S waves are reflected to the surface light-emitting apparatus 30 side, thereby increasing P waves transmitting through the image display section D. This allows an increase in integrated light intensity, resulting in a luminance increase. In this manner, the first light modulating sheet 23 and the second light modulating sheet 24 can reduce non-uniform brightness.

The surface light-emitting apparatus 30 includes a device mounting substrate 31 and light-emitting devices 32. The device mounting board 31 is a printed-wiring substrate in which a wiring pattern for supplying power to the light-emitting devices 32 is formed in a large-size insulating substrate made of, e.g., epoxy resin.

Figure 2:
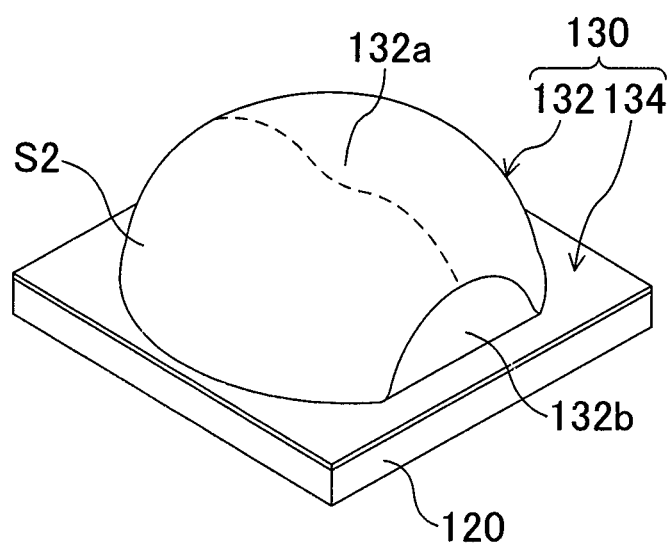
FIG. 2 is a perspective view illustrating a light-emitting device of the embodiment.
Figure 3:
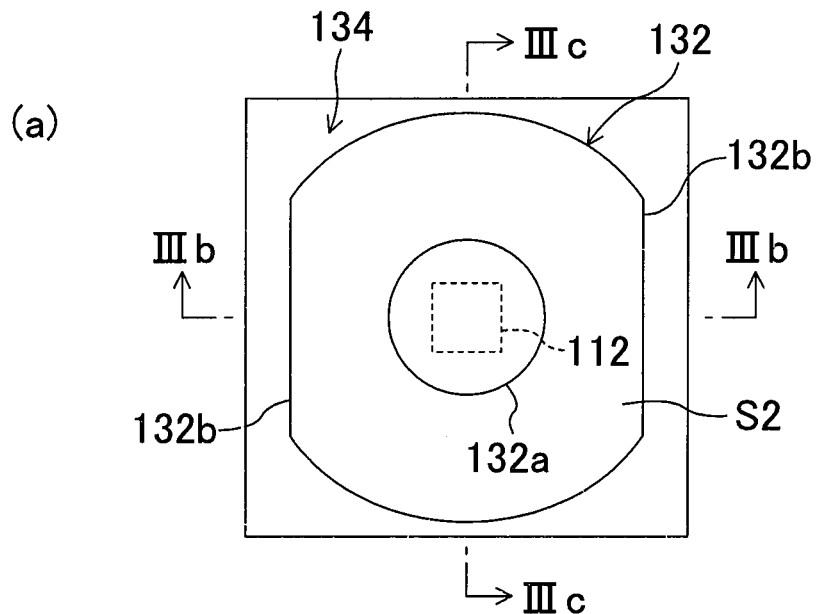
FIGS. 3(a)-3(c) illustrate the light-emitting device of the embodiment.
Figure 3:
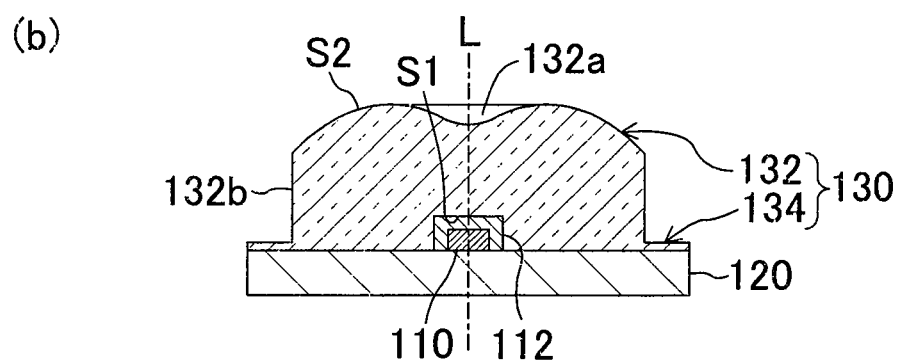
Figure 3:
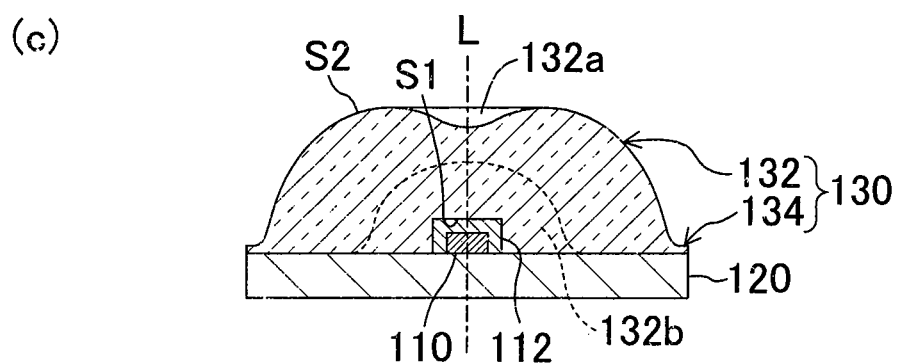

Next, a structure of the light-emitting device 32 will be described with reference to the drawings. FIG. 2 schematically illustrates a shape of the light-emitting device 32. FIGS. 3(a)-3(c) illustrate a planar structure, an cross-sectional structure, and an IIIc-IIIc cross-sectional structure of the light-emitting device 32, respectively. The light-emitting device 32 includes a light-emitting element 110; a printed-wiring substrate 120 holding the light-emitting element 110; and a light guiding member 130 covering over the light-emitting element 110. The light-emitting element 110 is a blue light-emitting diode in which an n-type semiconductor layer, a light-emitting layer, and a p-type semiconductor layer are formed in order, and which functions as a point light source by applying voltage to an n-side electrode formed on the n-type semiconductor layer exposed by etching the light-emitting layer, the p-type semiconductor layer, and a part of the n-type semiconductor layer, and to a p-side electrode connected to the p-type semiconductor layer.

Figure 4:
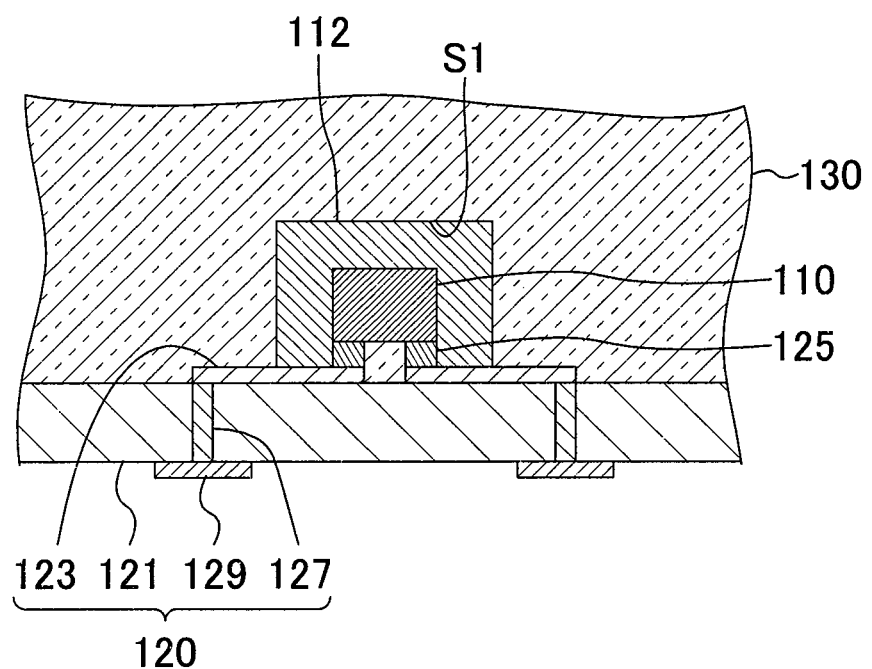
FIG. 4 is a cross-sectional view focusing on a light-emitting element section of the light-emitting device of the embodiment.

As illustrated in FIG. 4, the light-emitting element 110 is connected to a wiring pattern 123 formed on the printed-wiring substrate 120. In the printed-wiring substrate 120, the wiring pattern 123 for supplying power to the n-side and p-side electrodes of the light-emitting element 110 through bumps 125 is formed on an insulating board 121 made of epoxy resin or ceramic. The wiring pattern 123 is conductively connected to external terminals 129 through through-hole electrodes 127.

The light-emitting element 110 is entirely covered with a fluorescent layer 112. The fluorescent layer 112 is a resin layer containing phosphor, which is formed so as to have a rectangular parallelepiped outer shape. The phosphor has the yellow color which is a complementary color of the blue color emitted from the light-emitting element 110, thereby realizing the light-emitting device 32 which emits white color light by mixing the blue and yellow colors. As the phosphor, silicate phosphor or yttrium aluminum garnet (YAG) phosphor may be used. The fluorescent layer 112 may be formed by a printing process.

The light guiding member 130 is made of silicone resin, and is for distributing light from the light-emitting element 110 in a broad area. The fluorescent layer 112 may be formed on the printed-wiring substrate 120 on which the light-emitting element 110 is mounted, followed by forming the light guiding member 130 by compression molding or transfer molding. The light guiding member 130 includes a lens section 132, and a flange section 134 formed around the lens section 132 so as to have a square-planar outer shape. Mirror finish is preferably applied to the light guiding member 130.

The lens section 132 is an approximately hemispherical lens. The lens section 132 is formed so as to cover over the light-emitting element 110, and the light-emitting element 110 is arranged at the center of a bottom surface of the lens section 132 so that an optical axis of the lens section 132 is coincident with a reference optical axis L of the light-emitting element 110. The reference optical axis L is a virtual line upwardly extending from a top surface of the light-emitting element 110. In the lens section 132, portions of the approximately hemispherical section, which face each other across the reference optical axis L, are removed, and the lens section 132 includes two flat sections 132b along the reference optical axis L. The flat sections 132b are parallel to each other, and are formed in parallel to the reference optical axis L.

An exit surface S2 of the lens section 132, which is an upwardly-protruding curved surface, is defined between the two flat sections 132b. In an area of the exit surface S2, which contains the reference optical axis L, a concave section 132a having an approximately hemispherical shape or a recessed shape formed by removing a part of a spherical surface is formed about the reference optical axis L. An interface between the lens section 132 and the fluorescent layer 112 defines an entrance surface S1 on which light from the light-emitting element 110 is incident.

Figure 5:
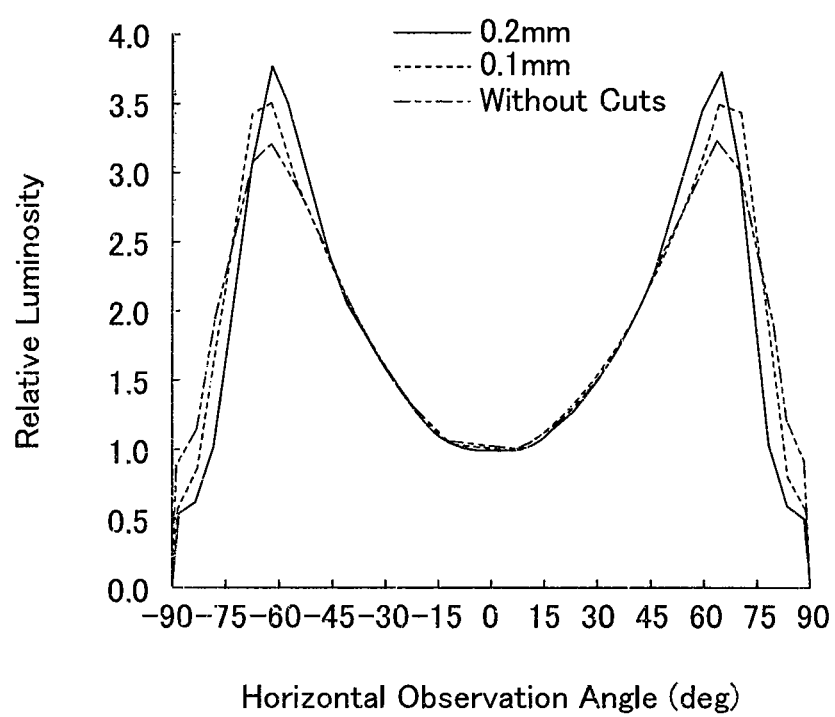
FIGS. 5(a) and 5(b) are plots illustrating light distribution characteristics of the light-emitting device of the embodiment.
Figure 5:
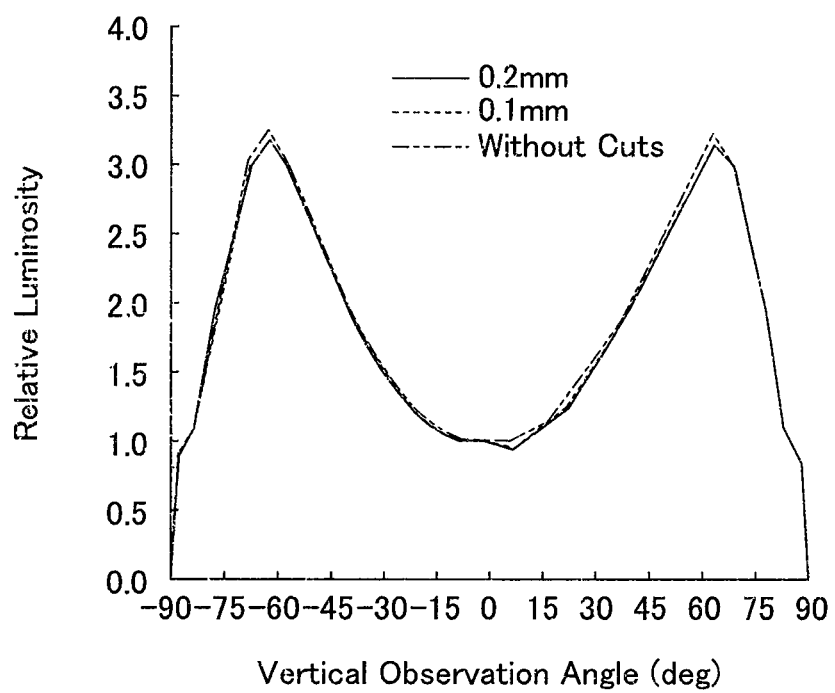
Figure 6:
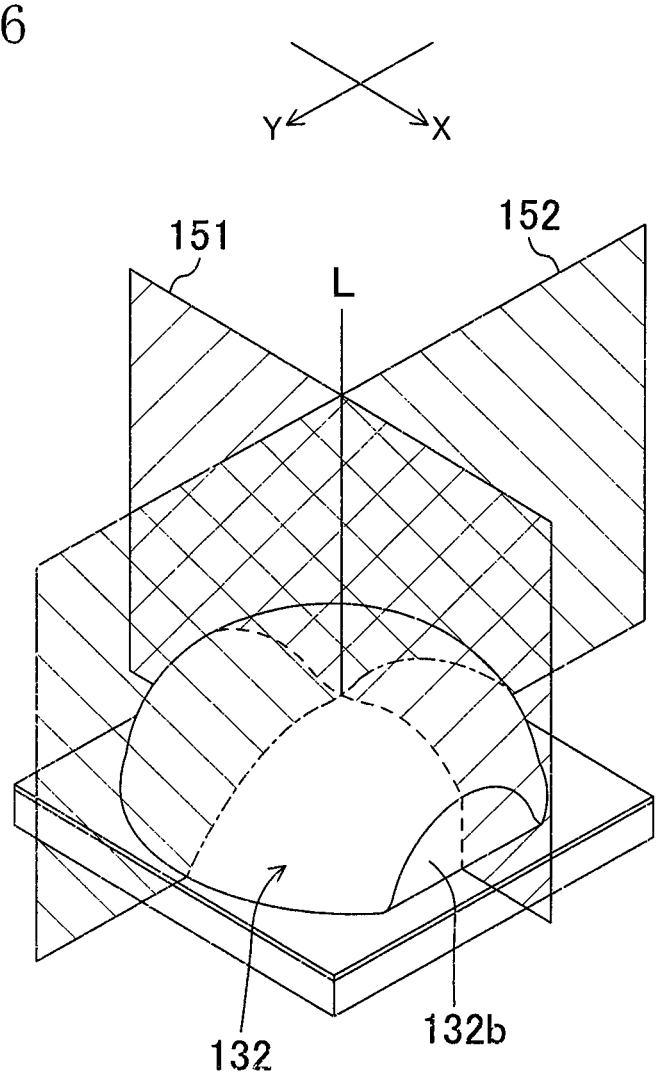
FIG. 6 is a view illustrating the first and second virtual planes.

Next, light distribution characteristics of the light-emitting device of the present embodiment will be described. FIGS. 5(a) and 5(b) illustrate light distribution curves of the light-emitting device of the present embodiment. FIG. 5(a) is the light distribution curve in a first virtual plane 151 illustrated in FIG. 6, and FIG. 5(b) is the light distribution curve in a second virtual plane 152 illustrated in FIG. 6. The first virtual plane 151 is a plane which contains the reference optical axis L, and which extends in an x direction so as to connect the two flat sections 132b. The second virtual plane 152 is a plane perpendicular to the first virtual plane, which extends in a y direction. In the lens section 132 of the light-emitting device used to measure the light distribution characteristics, both end portions of the approximately hemispherical lens having a diameter of 3.6 mm are cut off 0.1 mm or 0.2 mm from lens ends to form the flat sections 132b.

As illustrated in FIG. 5(a), the light distribution curve in the first virtual plane 151 has the maximum value (local maximum value) of relative luminosity around a horizontal observation angle of ±60° from the reference optical axis. L, resulting in the curve showing that the luminous intensity is reduced along the reference optical axis L. This is because light in the reference optical axis L direction is circumferentially expanded by the concave section 132a formed in a top portion of the lens section 132. Thus, the concave section 132a is provided in the top portion of the approximately hemispherical lens section 132, thereby evenly illuminating a broad area.

When the end portions of the hemispherical lens are cut off 0.1 mm or 0.2 mm from the lens ends to form the flat sections 132b, the relative luminosity maximum value is higher than the relative luminosity maximum value when a hemispherical lens without the flat sections 132b is used, and such value is equal to or greater than 3.5. The increase in the relative luminosity by forming the flat sections 132b is caused because light incident on the flat sections 132b from the light-emitting element 110 is refracted and reflected to a direction of light released through the exit surface S2 formed in the approximately hemispherical shape (direction in which the relative luminosity becomes maximum). In addition, the increase in the relative luminosity is much effective at narrower intervals between the flat sections 132b.

On the other hand, as illustrated in FIG. 5(b), the light distribution curve in the second virtual plane 152 has the local maximum value of relative luminosity around a vertical observation angle of ±60° as in the light distribution curve in the first virtual plane 151, resulting in the curve showing that the luminous intensity is reduced along the reference optical axis L. However, unlike the light distribution curve in the first virtual plane, the local maximum value of relative luminosity when the flat sections 132h are formed is approximately equal to that when the flat sections 132b are not formed. This is because, in the second virtual plane 152, the light-emitting device has approximately the same shape both when the flat sections 132b are formed, and when the flat sections 132b are not formed.

Figure 7:
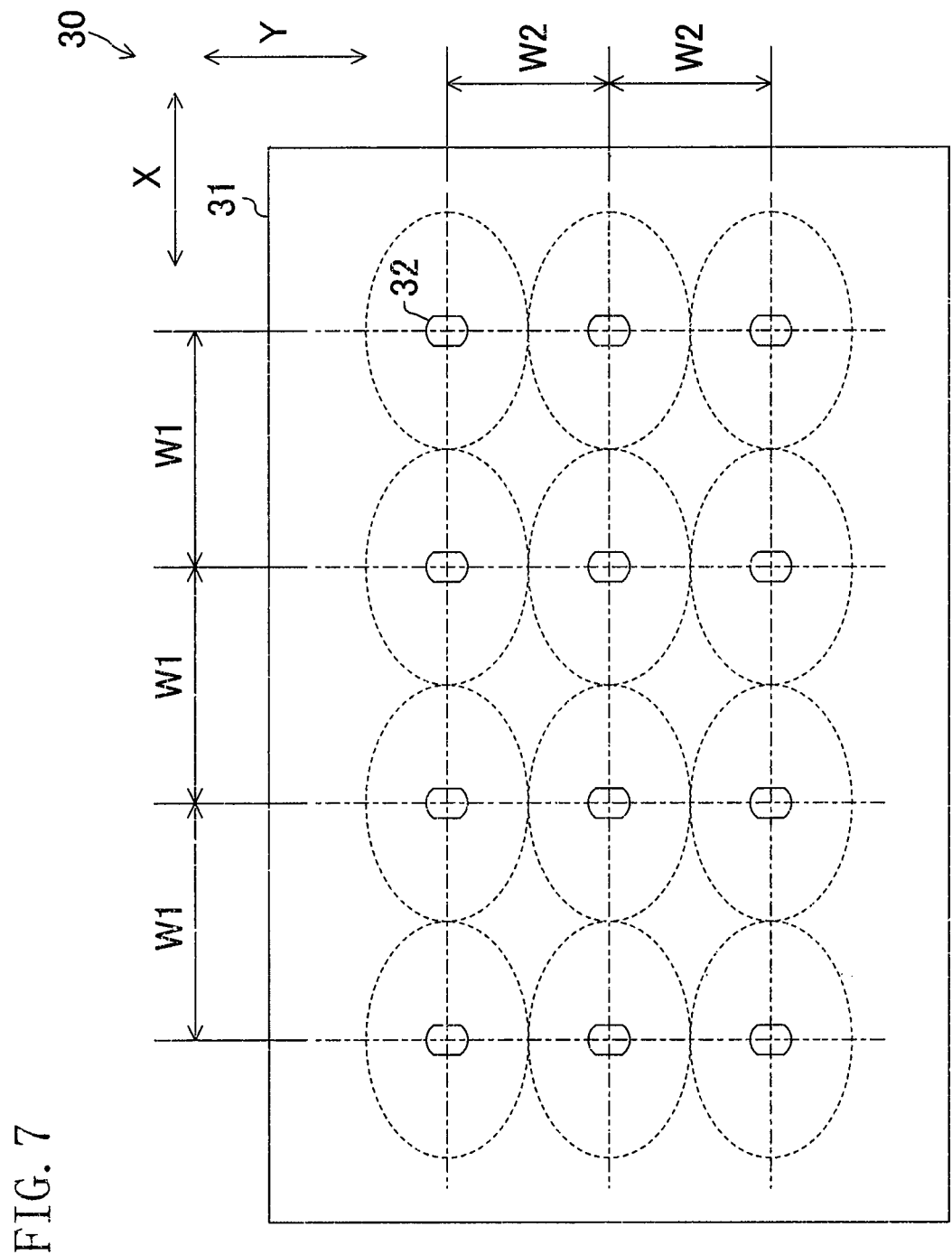
FIG. 7 is a plan view illustrating arrangements in a surface light-emitting apparatus of the embodiment.

As described above, when the light-emitting devices without the flat sections 132b, from which light is isotropically diffused, are arranged in the rectangular-grid pattern to form the surface light-emitting apparatus, illumination light from a light-emitting device is overlapped with illumination light from other light-emitting device in the short axis direction, resulting in an excessive increase in luminance; or illumination light from the light-emitting devices is insufficient in the long axial direction, resulting in a decrease in luminance. Thus, uniform illumination cannot be obtained. On the other hand, in the light-emitting device of the present embodiment with the flat sections 132b, an area where light is diffused, in the direction crossing the flat sections 132b (x direction) is broader than an area where light is diffused in the direction parallel to the flat sections 132b (y direction). Thus, as illustrated in FIG. 7, when mounting and arranging a plurality of light-emitting devices on the device mounting substrate 31 to form a surface light-emitting apparatus, even if the light-emitting devices 32 are arranged in the rectangular-grid pattern in which a width in the long axis direction is "W1," and a width in the short axis direction is "W2," the uniform illumination can be obtained across an entire region. In such a case; the light-emitting, devices 32 may be arranged so that the flat sections 132b of the adjacent light-emitting devices 32 in the long axis direction face each other. That is, the direction crossing the flat sections 132b of the light-emitting devices 32 (x direction) may be coincident with the long axis, and the direction parallel to the flat sections 132b (y direction) may be coincident with the short axis. In addition, the width W1 may be longer than the width W2, but the ratio of the width W1 to the width. W2 may be determined depending on the light distribution characteristics of the light-emitting devices 32 as necessary. In this manner, the light-emitting devices 32 of the present embodiment can easily realize the surface light-emitting apparatus suitable for the display system including a landscape-oriented display section.

Figure 8:
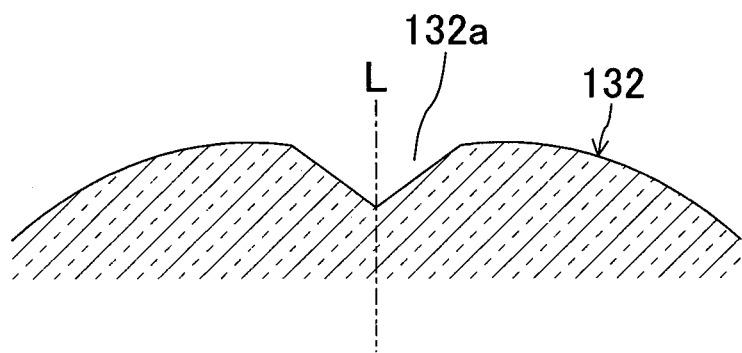
FIGS. 8(a)-8(c) are cross-sectional views illustrating variations of a concave section formed in a lens section of the light-emitting device of the embodiment.
Figure 8:
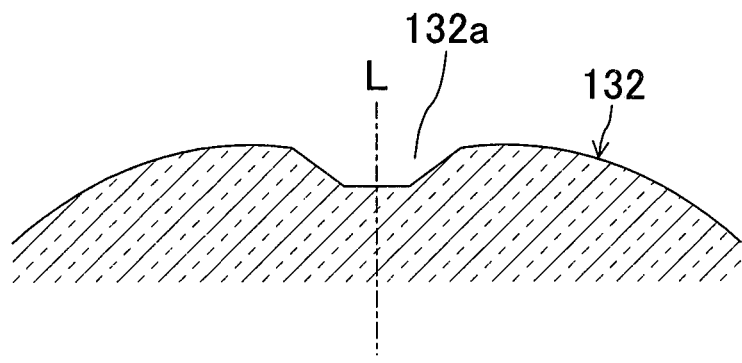
Figure 8:
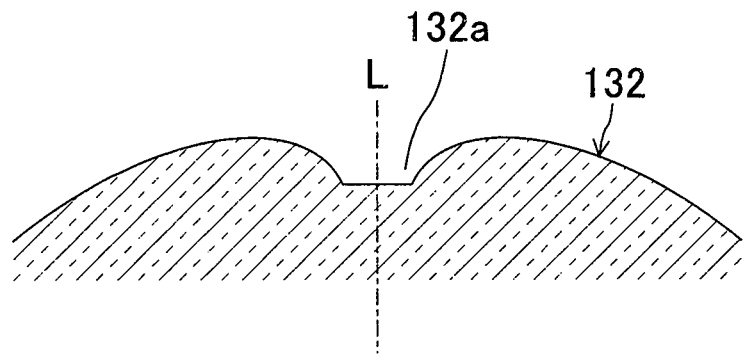

In the present embodiment, the concave section 132a has the approximately hemispherical shape or the recessed shape formed by removing a part of the spherical surface. However, the concave section 132a may refract light along the reference optical axis of the light-emitting element and light therearound so that such light is diffused so as to be apart from the reference optical axis. Thus, as illustrated in FIG. 8(a), the concave section 132a may have a conical shape. In addition, as illustrated in FIG. 8(b), the concave section 132a may have a conical trapezoidal shape in which a diameter at an outer circumferential end of the concave section 132a is larger than a bottom surface diameter, and the diameter is linearly decreased from an upper portion to a bottom surface; and, as illustrated in FIG. 8(c), the concave section 132a may have a shape in which a diameter is significantly changed around the outer circumferential end of the concave section 132a, and the diameter is decreased in a curve from the upper portion to the bottom surface.

The concave section 132a has such shapes, and therefore side surfaces of the concave section 132a are inclined surfaces defined by straight lines or upwardly-protruding curved lines as viewed in cross section. In the inclined surfaces, light along the reference optical axis L is refracted so as to be apart from the reference optical axis L. Thus, luminance along the reference optical axis L can be adjusted, and only a section along the reference optical axis L does not become too bright, thereby obtaining the uniform illumination. In addition, mold processing for forming the lens section 132 is facilitated, and variation in a cavity shape is reduced particularly in a multi-cavity mold. This provides an advantage that an illumination uniformity ratio on a back light in which many light-emitting devices are arranged is improved.

Figure 9:
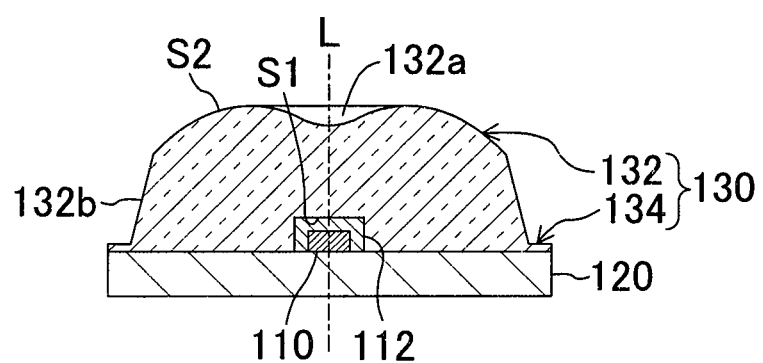
FIGS. 9(a) and 9(b) are cross-sectional views illustrating variations of a flat section formed in the lens section of the light-emitting device of the embodiment.
Figure 9:
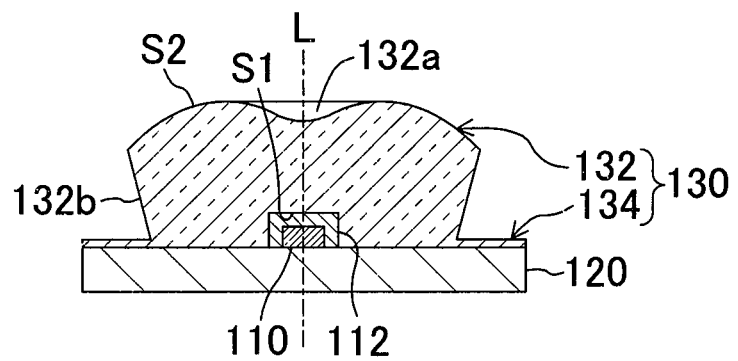

When the two flat sections 132b are parallel to each other, are parallel to the reference optical axis L, and are formed at the same distance from the reference optical axis L, the light distributions in the two flat sections are not displaced, resulting in the uniform illumination. However, the distances between each of the two flat sections 132b and the reference optical axis L are not necessarily the same. In addition, as illustrated in FIG. 9, the flat sections 132b may not be parallel to the reference optical axis L, but may be inclined toward the reference optical axis L. For example, as illustrated in FIG. 9(a), a distance between the two flat sections 132b facing each other may be gradually narrowed toward the top portion; or as illustrated in FIG. 9(b), a distance between the two flat sections 132b facing each other may be gradually expanded toward the top portion. This allows relative luminance adjustment in the x direction at the horizontal observation angle, and also allows adjustment of intervals at which the light-emitting devices are arranged, and of the number of light-emitting devices.

INDUSTRIAL APPLICABILITY

The light-emitting device of the present invention is useful as a light-emitting device which can evenly illuminates a desired area even when the light-emitting devices are arranged in not only a square-grid pattern but also a rectangular grid pattern; and which is used for a surface light-emitting apparatus serving as, e.g., a back light particularly for a display system with a landscape-oriented display section, and used for a display system with a landscape-oriented display section.

DESCRIPTION OF REFERENCE CHARACTERS

20 Light Modulating Member
21 Diffuser Plate
22 Diffuser Sheet
23 First Light Modulating Sheet
24 Second Light Modulating Sheet
30 Surface Light-Emitting Apparatus
31 Device Mounting Substrate
32 Light-Emitting Device
110 Light-Emitting Element 112 Fluorescent Layer
120 Printed-Wiring Substrate
121 Insulating Board
123 Wiring Pattern
125 Bump
127 Through-Hole Electrode
129 External Terminal
130 Light Guiding Member
132 Lens Section
132a Concave Section
132b Flat Section
134 Flange Section
151 First Virtual Plane
152 Second Virtual Plane

The invention claimed is:

1. A light-emitting device, comprising:
a light-emitting element; and
a lens section covering over the light-emitting element,
wherein the lens section includes an entrance surface on which light from the light-emitting element is incident; an exit surface from which the light incident on the entrance surface is emitted; an optical axis extending so as to penetrate through the entrance and exit surfaces; a concave section formed in an area of the exit surface, which contains the optical axis; and first and second flat sections formed so as to face each other across the optical axis;
part of the exit surface between the first flat section and the concave section defines a first upwardly-protruding curved surface and part of the exit surface between the second flat section and the concave section defines a second upwardly-protruding curved surface;
the optical axis is coincident with a reference optical axis of the light-emitting element; and
said first upwardly-protruding curved surface extends from the first flat section to the concave section and said second upwardly-protruding curved surface extends from the second flat section to the concave section.

2. The light-emitting device of claim 1, wherein
a light distribution curve in a first virtual plane containing the optical axis and connecting the two flat sections, and a light distribution curve in a second virtual plane perpendicular to the first virtual plane have the local maximum value in a particular angular direction; and
the local maximum value of the light distribution curve in the first virtual plane is greater than the local maximum value of the light distribution curve in the second virtual plane.

3. The light-emitting device of claim 1, wherein
the two flat sections are parallel to each other, and are parallel to the optical axis; and
distances between each of the two flat sections and the optical axis are equal to each other.

4. The light-emitting device of claim 1, wherein
the two flat sections are inclined toward the optical axis; and
angles between each of the two flat sections and the optical axis are equal to each other.

5. The light-emitting device of claim 1, wherein
the concave section has a hemispherical shape, a conical shape, or a conical trapezoidal shape having an opening diameter larger than a bottom surface diameter.

6. A surface light-emitting apparatus, comprising:
a plurality of light-emitting devices of claim 1 arranged in a rectangular-grid pattern,
wherein the light-emitting devices are arranged so that the flat sections of the adjacent light-emitting devices in a long axial direction face each other.

7. A display system, comprising:
the surface light-emitting apparatus of claim 6; and
an image display section using light from the surface light-emitting apparatus as a light source.

8. The display system of claim 7, wherein
the image display section spatially modulates light from the surface light-emitting apparatus depending on image signals to display an image.

9. The display system of claim 8, wherein the image display section is a transmissive liquid crystal panel.

10. The light-emitting device of claim 1, wherein the lens section further includes first and second curved sections formed so as to face each other across the optical axis.

* * * * *